(12) United States Patent
Marcus et al.

(10) Patent No.: US 6,430,713 B1
(45) Date of Patent: Aug. 6, 2002

(54) SYSTEM AND METHOD FOR CONSTRUCTING LOW COMPLEXITY BLOCK CODERS

(75) Inventors: Brian Harry Marcus, Los Altos; Dharmendra Shantilal Modha, San Jose, both of CA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/345,579

(22) Filed: Jun. 30, 1999

(51) Int. Cl.[7] .......................... G06F 11/00; H03M 7/00
(52) U.S. Cl. ...................... 714/701; 341/58; 341/59; 341/95; 341/106; 360/40; 360/48
(58) Field of Search ................... 714/752, 746, 714/795, 796, 700, 701; 341/58, 59, 95, 81, 65, 68, 106, 61, 69; 360/32, 40, 48; 375/241, 290, 341; 711/200, 202, 206; 382/232

(56) References Cited

U.S. PATENT DOCUMENTS

| | | | |
|---|---|---|---|
| 4,707,681 A | | 11/1987 | Eggenberger et al. ........ 341/59 |
| 4,786,890 A | | 11/1988 | Marcus et al. ................ 341/81 |
| 4,864,303 A | * | 9/1989 | Ofek ............................. 341/95 |
| 4,893,199 A | | 1/1990 | Okada .......................... 360/48 |
| 5,196,849 A | | 3/1993 | Galbraith ..................... 341/59 |
| 5,241,395 A | | 8/1993 | Chen ........................ 358/261.3 |
| 5,448,642 A | * | 9/1995 | Yeh ............................. 382/232 |
| 5,600,812 A | | 2/1997 | Park ............................ 711/200 |
| 5,784,631 A | | 7/1998 | Wise .......................... 382/246 |
| 6,016,330 A | * | 1/2000 | Ashley et al. .............. 375/341 |
| 6,204,781 B1 | * | 3/2001 | Aziz et al. ..................... 341/59 |
| 6,241,778 B1 | * | 6/2001 | De Lind Van Wijngaarden et al. ........................... 341/58 |

OTHER PUBLICATIONS

PUBLICATION:"Finite–State Modulation Codes for Data Storage." Marcus et al. IEEE Journal on Selected Areas in Communications. vol. 10, No. 1. pp. 5–37. Jan. 1992.

* cited by examiner

*Primary Examiner*—Emmanuel L. Moise
(74) *Attorney, Agent, or Firm*—John L. Rogitz

(57) ABSTRACT

A method for designing a computer program for finding a low-complexity coder for constrained block codes for application to timing recovery or error control in data recording systems. The method includes (1) decomposing an input set of candidate codewords into simple subsets of codewords, (2) providing, for each simple subset of codewords, a respective subset of datawords, and (3) filling in certain coordinates in the datawords by values of certain coordinates in the codewords.

22 Claims, 5 Drawing Sheets

*OVERALL LOGIC*

OVERALL LOGIC

*FINDING SIMPLE SETS*

MAPPING

| COORDINATES = C | DATAWORDS = D | |
|---|---|---|
| STEP 66<br>ALL FREE COORDINATES<br>UNUSED<br>FIRST LEVEL | $\begin{pmatrix} a_0 & 1 & a_2 & 1 & a_4 \\ a_0 & 1 & a_2 & 0 & 1 \\ 1 & 0 & a_2 & 1 & a_4 \end{pmatrix} \rightarrow \begin{pmatrix} 1 & \square & \square & \square & \square \\ 0 & 1 & \square & \square & \square \\ 0 & 0 & \square & \square & \square \end{pmatrix}$ | ALL FREE<br>COORDINATES<br>UNFILLED |
| STEPS 72-82<br>USE $a_2$<br>SECOND LEVEL | $\begin{pmatrix} a_0 & 1 & a_2 & 1 & a_4 \\ a_0 & 1 & a_2 & 0 & 1 \\ 1 & 0 & a_2 & 1 & a_4 \end{pmatrix} \rightarrow \begin{pmatrix} 1 & \square & a_2 \\ 0 & 1 & a_2 \\ 0 & 0 & a_2 \end{pmatrix}$ | FILL $a_2$ |
| STEPS 72-82<br>USE $a_4$<br>THIRD LEVEL | $\begin{pmatrix} a_0 & 1 & a_2 & 1 & a_4 \\ a_0 & 1 & a_2 & 0 & 1 \\ 1 & 0 & a_2 & 1 & a_4 \end{pmatrix} \rightarrow \begin{pmatrix} 1 & \square & a_4 & a_2 \\ 0 & 1 & \square & a_2 \\ 0 & 0 & a_4 & a_2 \end{pmatrix}$ | FILL $a_4$ |
| STEP 70<br>USE $a_0$<br>FOURTH LEVEL | $\begin{pmatrix} a_0 & 1 & a_2 & 1 & a_4 \\ a_0 & 1 & a_2 & 0 & 1 \\ 1 & 0 & a_2 & 1 & a_4 \end{pmatrix} \rightarrow \begin{pmatrix} 1 & a_0 & a_4 & a_2 \\ 0 & 1 & a_0 & a_2 \\ 0 & 0 & a_4 & a_2 \end{pmatrix}$ | FILL $a_0$ |

*FIG. 7*

SYSTEM AND METHOD FOR CONSTRUCTING LOW COMPLEXITY BLOCK CODERS

BACKGROUND OF THE INVENTION

1. Field of the Invention

The present invention relates generally to protecting magnetic recording systems from errors, and more particularly to methods and systems for constructing block encoders (and corresponding decoders) for expanding shorter p-bit datawords to longer q-bit code words.

2. Description of the Related Art

In data recording devices such as magnetic or optical disk drives and tape drives, data to be recorded is received in groups of p-bit datawords, wherein p is an integer. As is known in the art, to reduce errors in the device it can be helpful to convert ("encode") the p-bit datawords into q-bit codewords, wherein q is an integer that is larger than p and the codewords consequently are longer than the datawords. The codewords, not the actual datawords, are then recorded. When a requesting device desires to retrieve the data, the codewords are converted back ("decoded") to the corresponding datawords, and the datawords are then sent to the requesting device. Using this encoding and decoding provides for timing recovery and/or reduces system errors and/or alleviates the effects of system errors when they occur.

When using longer codewords for error protection as set forth above, the acceptable codewords are characterized by certain constraints. For instance, the recording system might have a constraint that forbids any word from having three consecutive 0's in its bit stream. With this constraint, for example, a 9-bit word having the bit sequence 100111001 would be acceptable as a codeword, whereas a 9-bit word having the bit sequence 100011001 would not be acceptable. Additional system constraints might also forbid, e.g., any word from having more than two consecutive 0's at the start or end of the word, and so on. Accordingly, the set of codewords must be selected to satisfy the various constraints, with those words that do not satisfy the constraints being omitted from the set. Because a block code requires $2^P$ q-bit codewords, having to eliminate words that do not satisfy the constraints is not a problem, if "q" is sufficiently large: there are at least twice as many candidate codewords as datawords when q exceeds p by one, four times as many when q exceeds p by two, and so on.

Having set forth why codewords are used and the fact that they must be selected to meet certain system constraints, attention is now directed to the problem at hand, namely, mapping the datawords to corresponding codewords. It is important that the mapping be implementable with reasonable complexity in terms of logic gates and storage area required for the encoder. Finding such a mapping is non-trivial even in a relatively simple case where, e.g., 4-bit datawords are to be mapped to 5-bit codewords with the constraint that the bit stream never has three consecutive zeroes. In this simple example, there are 17 factorial (about $10^{14}$) candidate mappings. A bad mapping can result in an encoder that is unduly complex in terms of logic gates and storage area required for the encoder.

Owing to the enormous number of possible mappings for most encoding scenarios, it is not practical to wade through each and every candidate mapping to determine which one is best. Instead, data-to-codeword mappings currently are constructed empirically by hand, to yield a "good" mapping in terms of encoder complexity as measured by accepted test protocols in the art. This is very time-consuming and burdensome, but nevertheless necessary to provide low-complexity coders from both a storage area consumption and energy consumption standpoint. The present invention understands that while it might not be practical to find the "best" codeword-dataword mapping for any given combination of constraints, it is nevertheless possible to provide an automated system to find a "good" mapping.

SUMMARY OF THE INVENTION

A computer system includes a general purpose computer and a program of instructions that is accessible by the computer to undertake method acts to map p-bit datawords to q-bit codewords. The method acts undertaken by the computer include receiving an input set of q-bit candidate codewords, and using the input set of codewords to establish plural simple subsets of codewords, as "simple" is defined below. Also, the method acts include associating the subsets with respective p-bit datawords, and then mapping codewords to datawords using the subsets. In a preferred embodiment, the mapping act includes establishing at least some bit values of the datawords based on bit values of the codewords. The method constructs the decoder and then defines the encoder to be the inverse of the decoder.

As disclosed in greater detail below, the preferred method for constructing the decoder includes filling an index set $I_p$ with codewords from the input set, and then removing fixed coordinates and dependent coordinates from the index set $I_p$. Next, it is determined whether the input set is a simple set, using the index set $I_p$. When the input set is not a simple set, the input set is divided into at least two subsets. The act of dividing the input set is executed by determining a most constrained coordinate, and establishing a first subset containing all codewords having a zero binary value in the most constrained coordinate and a second subset containing all codewords having a binary value of one in the most constrained coordinate.

In accordance with the present invention, after decomposing the codewords into simple subsets, the codewords and datawords can be arranged in respective C and D matrices, and the mapping act includes designating free coordinates in datawords as unfilled and free coordinates in codewords as unused. A free coordinate is a coordinate other than a fixed or dependent coordinate, as defined below. A column j* of the D matrix that has a largest number of unfilled coordinates is identified, and for each j, $0 \leq j \leq q-1$, a number $d_j$ of rows of the D matrix is determined in which the coordinate j* has been previously filled with the free coordinate j. Additionally, for each j, a number $e_j$ of rows of the C matrix is determined for which the coordinate j is unused and the corresponding row of the D matrix is unfilled in coordinate j*. A coordinate j† is then defined to be the value of j that results in the maximum value of the sum of $d_j$ and $e_j$. For every row of the D matrix wherein the coordinate j* is unfilled and the coordinate j† is unused in the corresponding row of the C matrix, the value of the coordinate j† in the C matrix is assigned to the coordinate j* in the D matrix. The mapping act is recursively iterated until all coordinates of the D matrix have been filled. The system is also disclosed in combination with a data recording device.

In another aspect, a computer program device includes a computer program storage device that is readable by a digital processing apparatus. A program is on the program storage device, and the program includes instructions that can be executed by the digital processing apparatus for mapping a set of datawords to a set of codewords. The instructions include decomposing the set of codewords into subsets using a most constrained coordinate, and decomposing the set of datawords into subsets corresponding to the subsets of codewords. Also, the instructions include filling selected coordinates in the datawords with selected coordinates from the codewords.

In still another aspect, a computer-implemented method is disclosed for mapping datawords to codewords for recording of the codewords onto a storage medium. The method includes receiving a set of q-bit codewords and decomposing the set of codewords into subsets of codewords containing at least some fixed coordinates and at least some free coordinates. Moreover, for each subset of codewords, a respective subset of datawords is provided that contains at least some fixed coordinates and at least some free coordinates. The free coordinates in the subsets of datawords are filled with binary values from free coordinates in the subsets of codewords. In this manner, the decoder is implemented, and the encoder is derived as the inverse of the decoder.

The details of the present invention, both as to its structure and operation, can best be understood in reference to the accompanying drawings, in which like reference numerals refer to like parts, and in which:

BRIEF DESCRIPTION OF THE DRAWINGS

FIG. 7 is a schematic representation of the codeword matrix C and associated dataword matrix D.

DETAILED DESCRIPTION OF THE PREFERRED EMBODIMENTS

Figure 1:
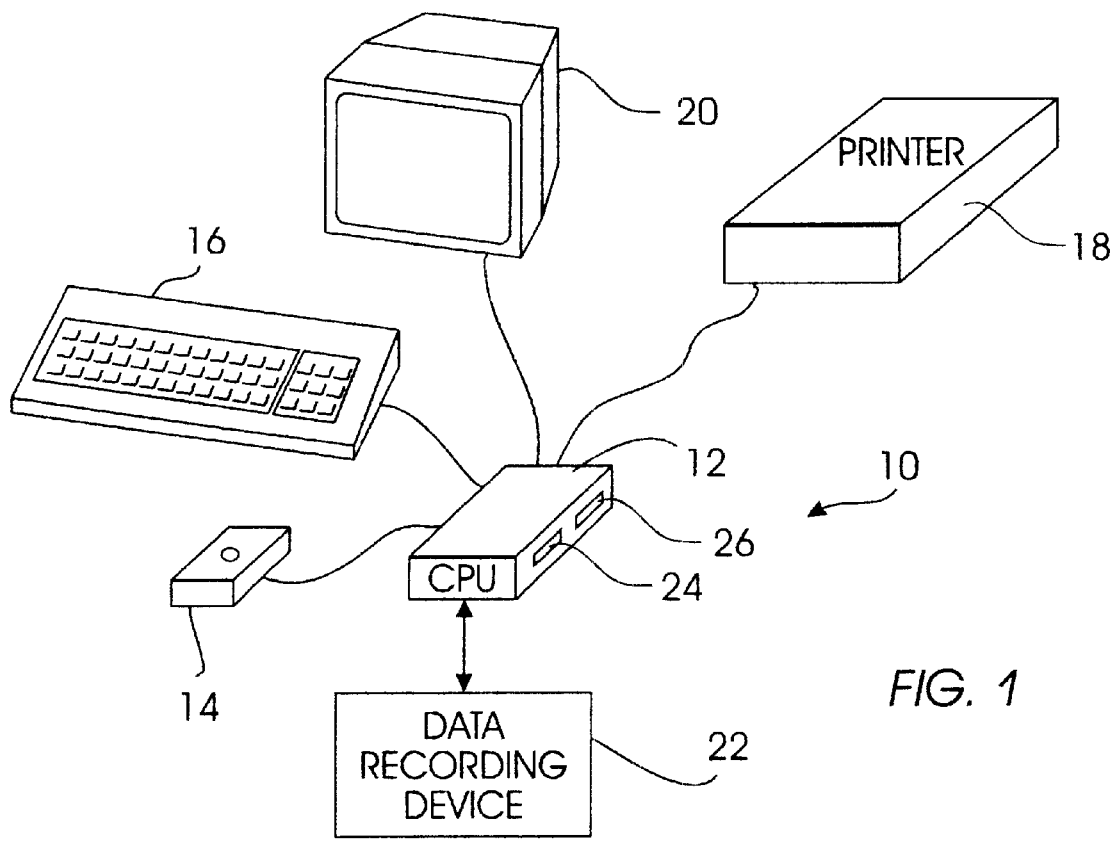
FIG. 1 is a schematic diagram showing the system of the present invention for constructing low complexity block coders.

Referring initially to FIG. 1, a system is shown, generally designated 10, for constructing low complexity block coders. In the particular architecture shown, the system 10 includes a digital processing apparatus, such as a computer 12. In one intended embodiment, the computer 12 may be a personal computer or laptop computer made by International Business Machines Corporation (IBM) of Armonk, N.Y., or the computer 12 may be any computer, including computers sold under trademarks such as AS400, with accompanying IBM Network Stations. Or, the computer 12 may be a Unix computer, or OS/2 server, or Windows NT server, or IBM workstation or an IBM laptop computer.

As shown in FIG. 1, the computer 12 is electrically connected to one or more input devices, e.g., a mouse 14 and a keyboard 16, which can be manipulated by a user of the system 10 to generate requests for undertaking the block coder mapping logic herein. The mapping can be output via an output device such as a printer 18 or monitor 20 or other output device such as other computers that are conventionally coupled to the computer 12. For example, the mapping can be output to a data recording device 22.

Figure 2:
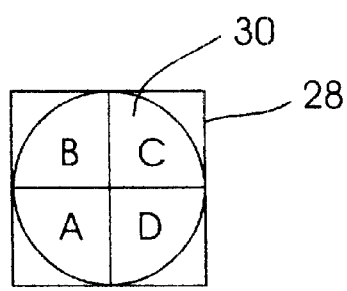
FIG. 2 is a schematic diagram of a computer program storage device.

It is to be understood that the logic of the present invention can be contained in an appropriate electronic data storage that includes, e.g., a hard disk drive 24 or optical disk drive 26 conventionally coupled to the computer 12. Or, as shown in FIG. 2 the logic can be stored on a floppy diskette 28 having a computer readable medium 30 and code elements A–D stored thereon.

The flow charts herein illustrate the structure of the quantile generator of the present invention as embodied in computer program software. Those skilled in the art will appreciate that the flow charts illustrate the structures of logic elements, such as computer program code elements or electronic logic circuits, that function according to this invention. Manifestly, the invention is practiced in its essential embodiment by a machine component that renders the logic elements in a form that instructs a digital processing apparatus (that is, a computer) to perform a sequence of function steps corresponding to those shown.

In other words, the logic may be a computer program that is executed by a processor within the computer 12 as a series of computer-executable instructions. In addition to the drives 24, 26, these instructions may reside, for example, in RAM of the computer 12, or the instructions may be stored on a DASD array, magnetic tape, electronic read-only memory, or other appropriate data storage device. In an illustrative embodiment of the invention, the computer-executable instructions may be lines of compiled $C^{++}$ compatible code.

Figure 3:
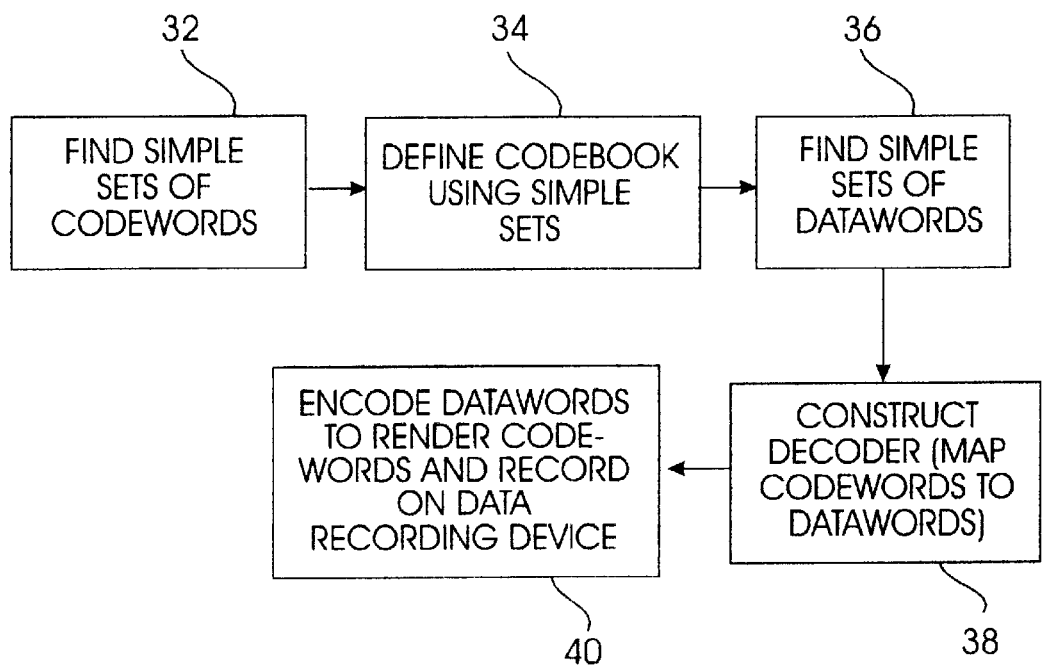
FIG. 3 is a flow chart showing the overall logic of the present invention.
Figure 4:
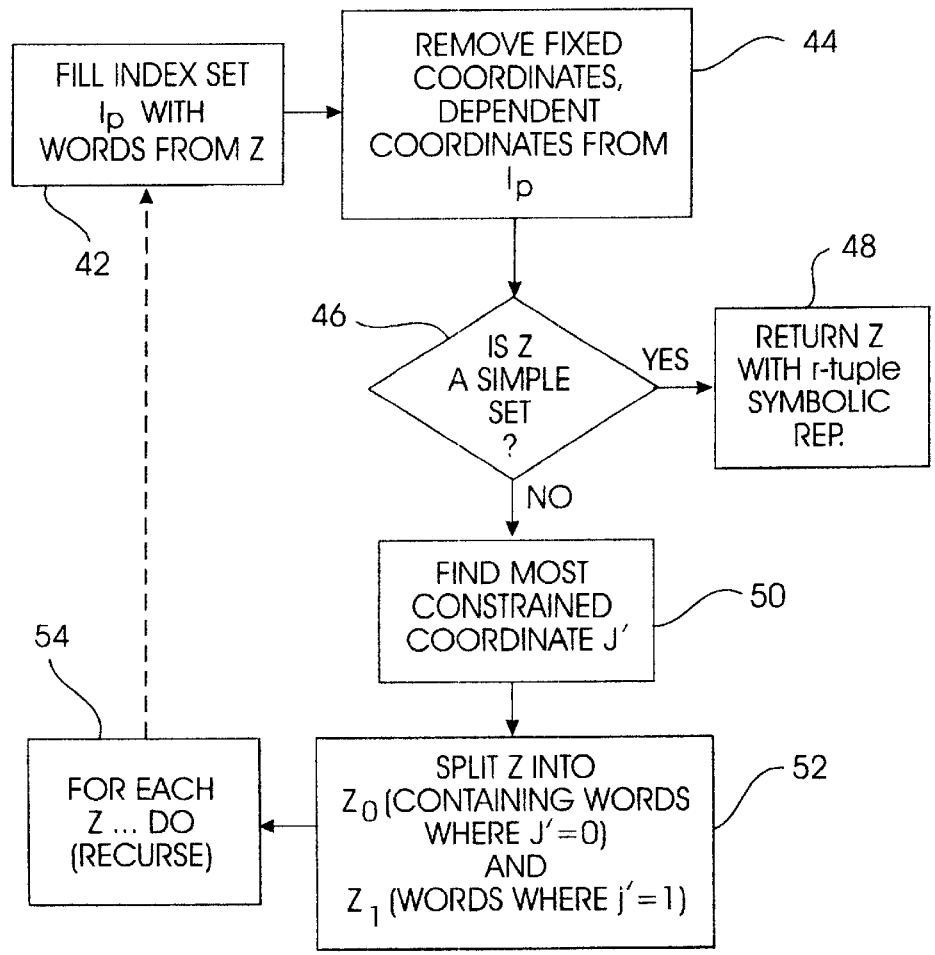
FIG. 4 is a flow chart showing the logic for decomposing an input set of codewords into simple subsets.
Figure 5:
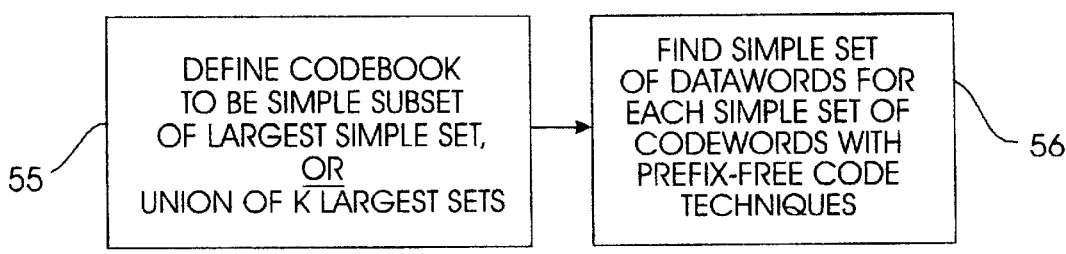
FIG. 5 is a flow chart showing the logic for defining the codebook.
Figure 6:
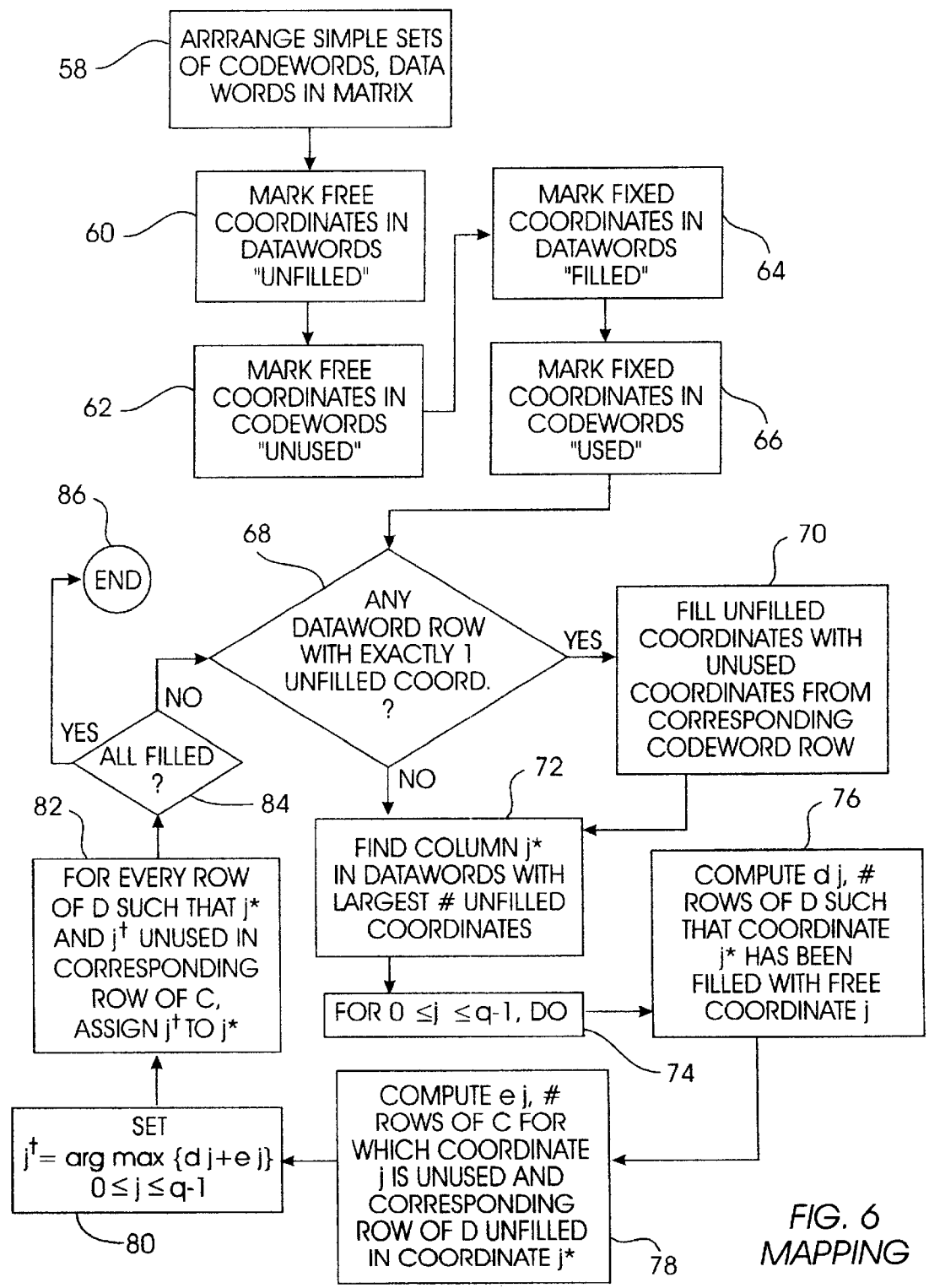
FIG. 6 is a flow chart showing the codeword-to-dataword mapping.

The overall logic of the present invention is shown in FIG. 3, details of which are set forth in FIGS. 4–6. Commencing at block 32, after receiving an input set Z of q-bit candidate codewords, the set is decomposed into simple subsets of codewords in accordance with disclosure below. The $j^{th}$ bits of the words, $0 \leq j \leq q-1$, in combination, establish a respective $j^{th}$ coordinate for the subset, in essence, a respective $j^{th}$ column of a matrix composed of rows of words. "Coordinate" is also used herein to refer to a single bit of a word that occupies a $j^{th}$ column of a word matrix.

By "simple subset" is meant a subset that contains exactly $2^s$ words such that "s" individual word coordinates of the subset are potentially free and the remaining coordinates are either fixed or dependent. By "fixed" coordinate is meant a coordinate that has the same binary value across the codewords in the subset, that is, the binary values of bits in a fixed coordinate column is the same, word to word. By "dependent" coordinate is meant a coordinate "i" that is a 1-bit Boolean function of another coordinate "j" in the subset, j<i, i.e., a coordinate "i" that either repeats the binary values of a preceding coordinate "j" for each word, or that has, for each word, the inverse of the binary value of a preceding coordinate "j". Potentially free coordinates are the non-dependent, non-fixed coordinates.

Moving to block 34, a codebook of codewords is defined using the simple subsets, as discussed further in relation to FIGS. 4 and 5. Proceeding to block 36, simple subsets of p-bit datawords, p<q, are determined, as also discussed further in relation to FIG. 5. Then, at block 38, a decoder is constructed, i.e., the codewords are mapped to datawords. Equivalently, an encoder is constructed, i.e., the datawords are mapped to the codewords. At block 40, using the encoder, datawords from a source are mapped to codewords, and the codewords are recorded on a data recording device such as a hard disk drive for error-reducing recording of the data represented by the codewords. Subsequently, when it is desired to retrieve the data, the codewords are decoded back to the datawords for use of the datawords by a requesting component, such as a computer.

Now referring to FIG. 4, commencing at block 42 an index set $I_p$ is filled with the codewords from the input set "Z", and then at block 44 all fixed and dependent coordinates are removed from the index set $I_P$. To illustrate, in the matrix below of 7-bit codewords, each codeword defines a matrix row, and coordinates 2 and 5 are fixed, because coordinate 2 always defines a binary value of "1" across the codewords in the set and coordinate 5 always defines a binary value of "0" across the codewords of the set. Moreover, coordinates 3 and 6 are dependent on the coordinate 0 because coordinate 3 is the inverse 1-bit Boolean function of coordinate 0 and coordinate 6 is the same as coordinate 1 across the four codewords. Also, coordinate 4 is dependent on the coordinate 1, and coordinates 0 and 1 are free.

| Coordinate number: | 0 | 1 | 2 | 3 | 4 | 5 | 6 |
|---|---|---|---|---|---|---|---|
| Codeword #1 | 0 | 0 | 1 | 1 | 0 | 0 | 0 |
| Codeword #2 | 0 | 1 | 1 | 1 | 1 | 0 | 0 |
| Codeword #3 | 1 | 0 | 1 | 0 | 0 | 0 | 1 |
| Codeword #4 | 1 | 1 | 1 | 0 | 1 | 0 | 1 |

With the above in mind, one way to compactly represent the above subset of codewords is by using the following tuple notation. For a fixed coordinate i, the $i^{th}$ coordinate is represented as either a 0 or 1, depending on its fixed value. For a dependent coordinate i that is dependent on a coordinate j, j<i, the coordinate can be represented as $a_j$ if the coordinates i and j are always equal, and otherwise represented as the inverse of $a_j$ (i.e., $\bar{a}_j$). A free coordinate i is represented as $a_i$. With these rules, the representation of the above four codewords would be ($a_0$, $a_1$, 1, $\bar{a}_0$, $a_j$, 0, $a_0$).

Proceeding to decision diamond 46, it is determined whether the input set Z is a simple set by determining whether the magnitude of Z is equal to $2^{lp}$. If it is, the input set Z is returned as a simple set at block 48, along with its tuple notation.

On the other hand, if the input set Z is not a simple set, the logic moves from decision diamond 46 to block 50, wherein a most constrained coordinate j' in the index set $I_p$ (hence, the most constrained non-fixed, non-dependent coordinate in the input set Z) is determined. By "most constrained" is meant the free coordinate that is closest to being a fixed coordinate, i.e., the fixed coordinate having the greatest imbalance between zeroes and ones across the set of words under test. Ties, if any, are resolved by selecting the smallest of the tied coordinates.

Once the most constrained coordinate has been determined, the logic moves to block 52 to split, divide, or otherwise decompose the set under test into two subsets along the most constrained coordinate. In other words, at block 52 the set under test is split into two subsets, one subset consisting of words that have a binary value of 0 in the most constrained coordinate position, and one subset consisting of words that have a binary value of 1 in the most constrained coordinate position. Block 54 indicates that the above process is recursively repeated by moving back to block 42 for each subset and processing the subsets in accordance with the above principles until no non-simple subsets remain.

Once the input set Z has been decomposed into simple subsets of codewords, the logic of FIG. 5 is invoked. Commencing at block 55, a codebook of codewords is defined as follows. Given a number "l" of simple subsets $Y_i$, i=1 to "l", with $\eta_i$ representing the number of words in $Y_i$ and $s_i = \log_2$ of $\eta_i$, find a unique k such that the (sum from i=1 to k of $\eta_i$) $\geq 2^p \geq$ (sum i=1 to (k-1) of $\eta_i$). If it is determined that k=1, the codebook is any simple subset of $Y_1$ defined by fixing exactly $s_1 - p$ of the free coordinates of $Y_1$. Otherwise (i.e., for k>1), the codebook is the union of the largest k simple subsets Y.

Proceeding to block 56, for each subset of codewords, a respective subset of datawords is provided that contains at least some fixed coordinates and at least some free coordinates, with the free coordinates in the subsets of datawords being filled with binary values from free coordinates in the subsets of codewords as set forth further below in reference to FIGS. 6 and 7. Because the datawords are not constrained, an entire set of them is simple; consequently, breaking up the datawords is done not to produce simple sets, but only to match the number of subsets $Y_i$ in the codebook. The preferred way to establish the subsets of datawords is to find a prefix-free code that satisfies the equation $l_i = p - s_i$, $1 \geq i \geq k$, wherein the prefix-free code (or an instantaneous code) has lengths $l_1, l_2, \ldots, l_k$ bits for each of the simple sets $Y_1, Y_2, \ldots, Y_k$, respectively. Examples of such prefix-free code are set forth in Cover et al., *Elements of Information Theory*, N.Y. (Wiley & Sons), 1991 and in Huffman, "A Method for the Construction of Redundancy-Free Code", Proc. IRE, vol. 40, pp. 1098–1101, September, 1952. Or, the arithmetic coding set forth in Rissanen, "Generalized Kraft Inequality and Arithmetic Coding", IBM J. Res. Dev., vol. 20, no. 3 (1976) can be used.

Now referring to FIGS. 6 and 7, at block 58 of FIG. 6, the codewords and datawords, as represented by the simple subsets into which they have been grouped and designated using the above-mentioned tuple notation, are arranged in respective C and D matrices, using q=5 and p=4 for illustration. As set forth further below, coordinates in a column of the D matrix that have a maximum value of unfilled free coordinates are filled using coordinate values from the C matrix, after which coordinates in other columns of the D matrix are filled.

Specifically, at block 60 of FIG. 6 all free coordinates in the datawords are marked "unfilled", and at block 62 all free coordinates in the codewords are marked "unused". Also, at block 64 fixed coordinates in the datawords are marked "filled" and fixed coordinates in the codewords are marked "used" at block 66. In the first level shown in FIG. 7, depicting the logic after block 66, the unused free coordinates in the C matrix are surrounded by boxes, whereas the unfilled free coordinates in the D matrix are represented by empty boxes.

Moving to decision diamond 68, it is determined whether any dataword matrix D row has exactly one unfilled coordinate. If so, the logic moves to block 70 to fill the unfilled coordinate with the unused coordinate from the corresponding codeword matrix C row. In the first pass through the logic, using the present example the test at decision diamond 68 would be negative.

From block 70 or from decision diamond 68 when the test there is negative, the logic moves to block 72. At block 72, a column j* in the D matrix is found that has the largest number of unfilled coordinates. In the case of a tie, the largest coordinate is selected. Accordingly, in the example shown in FIG. 7, the last column of the D matrix defines the column j*.

A DO loop is then entered at block 74 for all the coordinates "j". At block 76, for each j the number of rows $d_j$ in the D matrix is computed such that the coordinate j* of that row has already been filled with a free coordinate from the C matrix. In the first loop through the algorithm, using the present example, no unfilled coordinates of the D matrix have yet been filled, so the value of $d_j$ for all j is zero in the first loop.

Next moving to block 78, for each j a number of rows $e_j$ in the C matrix is computed for which the coordinate j is unused and the corresponding row in the D matrix is unfilled in the coordinate j*. Using the example shown in FIG. 7, for the first loop through the algorithm $e_0=2$, $e_1=0$, $e_2=3$, $e_3=0$, and $e_4=2$.

From block 78, the logic moves to block 80. At block 80, a coordinate j† is determined that results in the maximum value for the sum of $d_j+e_j$. Using the above example for the first loop, the value of j resulting in the maximum value of $d_j+e_j$ is two (2). Thus, the coordinate j†=2 in this example.

To fill unfilled coordinates in the D matrix using values from the C matrix, the logic moves from block 80 to block 82. At block 82, for every row of the D matrix such that the coordinate j* is unfilled and the coordinate j† is unused in the corresponding row of the C matrix, the value of the coordinate j† in the C matrix is assigned (mapped) to the corresponding unfilled coordinate j* in the D matrix. This is illustrated in the second level in FIG. 7, in which the coordinate j* (the last column of the D matrix) has been filled in with the value $a_2$ (the value from the coordinate j† in the C matrix).

Having filled some of the unfilled coordinates of the D matrix at block 82, the logic moves to decision diamond 84 to determine whether all coordinates in the D matrix have been filled. If they have, indicating that the codebook has been completely mapped to the datawords (and vice-versa), the process ends at state 86. Otherwise, the logic loops back to decision diamond 68. The third level in FIG. 7 represents the matrices C and D after the second loop through the algorithm, and the fourth level in FIG. 7 represents the third and last loop through algorithm for the example shown, wherein the test at decision diamond 68 is positive and the logic simply ignores steps subsequent to block 70 because the mapping is complete.

While the particular SYSTEM AND METHOD FOR CONSTRUCTING LOW COMPLEXITY BLOCK CODERS as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular means "at least one" unless otherwise recited.

We claim:

1. A computer system, comprising:
   a general purpose computer; and
   a program of instructions accessible by the computer to undertake method acts to map p-bit datawords to q-bit codewords, the method acts comprising:
      receiving an input set of q-bit candidate codewords;
      using the input set of codewords, establishing plural simple subsets of codewords;
      associating the subsets with respective p-bit datawords; and
      mapping codewords to datawords using the subsets.

2. The computer system of claim 1, wherein the mapping act executed by the computer further includes establishing at least some bit values of the datawords based on bit values of the codewords.

3. The computer system of claim 2, wherein the acts executed by the computer further include:
   filling an index set $I_p$ with codewords from the input set;
   removing fixed coordinates and dependent coordinates from the index set $I_p$;
   determining whether the input set is a simple set using the index set $I_p$; and
   when the input set is not a simple set, dividing the input set into at least two subsets.

4. The computer system of claim 3, wherein the act of dividing the input set is executed by determining a most constrained coordinate, and establishing a first subset containing all codewords having a zero binary value in the most constrained coordinate and a second subset containing all codewords having a binary value of one in the most constrained coordinate.

5. The computer system of claim 3, wherein the codewords and datawords can be arranged in respective C and D matrices, and the mapping act executed by the computer includes:
   designating free coordinates in datawords as unfilled and free coordinates in codewords as unused, a free coordinate being a coordinate other than a fixed coordinate or dependent coordinate;
   identifying a column j* of the D matrix having a largest number of unfilled coordinates;
   for each j, $0 \leq j \leq q-1$, determining the number $d_j$ of rows of the D matrix in which the coordinate j* has been filled with the free coordinate j;
   for each j, $0 \leq j \leq q-1$, determining the number $e_j$ of rows of the C matrix for which the coordinate j is unused and the corresponding row of the D matrix is unfilled in coordinate j*;
   defining a coordinate j† to be the value of j resulting in the maximum value of the sum of $d_j$ and $e_j$; and
   for every row of the D matrix wherein the coordinate j* is unfilled and the coordinate j† is unused in the corresponding row of the C matrix, assigning the value of the coordinate j† in the C matrix to the coordinate j* in the D matrix.

6. The computer system of claim 5, wherein the method acts executed by the computer further comprise:
   recursively iterating the mapping act until all coordinates of the D matrix have been filled.

7. The computer system of claim 6, wherein the method acts executed by the computer further comprise:
   determining whether any row in the D matrix has exactly one unfilled coordinate, and if so, filling the coordinate with the unused coordinate in the corresponding row of the C matrix.

8. The computer system of claim 1, in combination with a data recording device.

9. A computer program device comprising:
   a computer program storage device readable by a digital processing apparatus; and
   a program on the program storage device and including instructions executable by the digital processing apparatus for performing method acts for mapping a set of codewords to a set of datawords, the method acts comprising:
      decomposing the set of codewords into subsets using a most constrained coordinate;

decomposing the set of datawords into subsets corresponding to the subsets of codewords; and filling selected coordinates in the datawords with selected coordinates from the codewords.

10. The device of claim 9, wherein the filling act includes mapping datawords to codewords by establishing at least some bit values of the datawords based on bit values of the codewords.

11. The device of claim 10, wherein the acts further include:

filling an index set $I_p$ with codewords from the input set;

removing fixed coordinates and dependent coordinates from the index set $I_p$;

determining whether the input set is a simple set using the index set $I_p$; and when the input set is not a simple set, dividing the input set into at least two subsets.

12. The device of claim 11, wherein the act of dividing the input set is executed by determining a most constrained coordinate, and establishing a first subset containing all codewords having a zero binary value in the most constrained coordinate and a second subset containing all codewords having a binary value of one in the most constrained coordinate.

13. The device of claim 12, wherein the codewords and datawords can be arranged in respective C and D matrices, and the mapping act includes:

designating free coordinates in datawords as unfilled and free coordinates in codewords as unused, a free coordinate being a coordinate other than a fixed coordinate or dependent coordinate;

identifying a column j* of the D matrix having a largest number of unfilled coordinates;

for each j, $0 \leq j \leq q-1$, determining the number $d_j$ of rows of the D matrix in which the coordinate j* has been filled with the free coordinate j;

for each j, $0 \leq j \leq q-1$, determining the number $e_j$ of rows of the C matrix for which the coordinate j is unused and the corresponding row of the D matrix is unfilled in coordinate j*;

defining a coordinate j† to be the value of j resulting in the maximum value of the sum of $d_j$ and $e_j$; and for every row of the D matrix wherein the coordinate j* is unfilled and the coordinate j† is unused in the corresponding row of the C matrix, assigning the value of the coordinate j† in the C matrix to the coordinate j* in the D matrix.

14. The device of claim 13, wherein the method acts further comprise:

recursively iterating the mapping act until all coordinates of the D matrix have been filled.

15. The device of claim 14, wherein the method acts further comprise:

determining whether any row in the D matrix has exactly one unfilled coordinate, and if so, filling the coordinate with the unused coordinate in the corresponding row of the C matrix.

16. The computer program device of claim 9, in combination with a data recording device.

17. A computer-implemented method for mapping codewords to datawords for recording of the codewords onto a storage medium, comprising the acts of:

receiving a set of q-bit candidate codewords;

decomposing the set of codewords into subsets of codewords containing at least some fixed coordinates and at least some free coordinates;

for each subset of codewords, providing a respective subset of datawords containing at least some fixed coordinates and at least some free coordinates; and filling free coordinates in the subsets of datawords with binary values from free coordinates in the subsets of codewords.

18. The method of claim 17, wherein the codewords and datawords can be arranged in respective C and D matrices, and the filling act is undertaken by first filling coordinates in a column of the D matrix having a maximum value of unfilled free coordinates, prior to filling coordinates in other columns of the D matrix.

19. The method of claim 17, wherein the decomposing act is undertaken by determining a most constrained coordinate, and establishing a first subset containing all codewords having a zero binary value in the most constrained coordinate and a second subset containing all codewords having a binary value of one in the most constrained coordinate.

20. The method of claim 19, wherein the acts further include:

filling an index set $I_p$ with codewords from the input set;

removing fixed coordinates and dependent coordinates from the index set $I_p$;

determining whether the input set is a simple set using the index set $I_p$; and when the input set is not a simple set, dividing the input set into at least two subsets.

21. The method of claim 20, wherein the codewords and datawords can be arranged in respective C and D matrices, and the filling act includes:

designating free coordinates in datawords as unfilled and free coordinates in codewords as unused, a free coordinate being a coordinate other than a fixed coordinate or a dependent coordinate;

identifying a column j* of the D matrix having a largest number of unfilled coordinates;

for each j, $0 \leq j \leq q-1$, determining the number $d_j$ of rows of the D matrix such that the coordinate j* has been filled with the free coordinate j;

for each j, $0 \leq j \leq q-1$, determining the number $e_j$ of rows of the C matrix for which the coordinate j is unused and the corresponding row of the D matrix is unfilled in coordinate j*;

defining a coordinate j† to be the value of j resulting in the maximum value of the sum of $d_j$ and $e_j$; and for every row of the D matrix wherein the coordinate j* is unfilled and the coordinate j† is unused in the corresponding row of the C matrix, assigning the value of the coordinate j† in the C matrix to the coordinate j* in the D matrix.

22. The method claim 21, wherein the method acts further comprise:

recursively iterating the filling act until all coordinates of the D matrix have been filled.

* * * * *